(12) United States Patent
Wang

(10) Patent No.: US 7,410,886 B2
(45) Date of Patent: Aug. 12, 2008

(54) METHOD FOR FABRICATING PROTECTIVE CAPS FOR PROTECTING ELEMENTS ON A WAFER SURFACE

(75) Inventor: Wei-Chung Wang, Kao-Hsiung Hsien (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 276 days.

(21) Appl. No.: 11/164,965

(22) Filed: Dec. 13, 2005

(65) Prior Publication Data

US 2007/0031994 A1 Feb. 8, 2007

(30) Foreign Application Priority Data

Aug. 3, 2005 (TW) .............................. 94126375 A

(51) Int. Cl.
*H01L 21/30* (2006.01)
*H01L 21/46* (2006.01)

(52) U.S. Cl. .................. 438/456; 438/455; 438/121; 438/700; 257/704; 257/E23.181

(58) Field of Classification Search ................ 438/455, 438/456, 121, 700; 257/704, E23.181
See application file for complete search history.

(56) References Cited

U.S. PATENT DOCUMENTS

| | | | |
|---|---|---|---|
| 6,777,263 B1 * | 8/2004 | Gan et al. ................ 438/106 |
| 7,045,868 B2 * | 5/2006 | Ding et al. ................ 257/414 |
| 7,138,293 B2 * | 11/2006 | Ouellet et al. ............ 438/106 |
| 7,160,476 B2 * | 1/2007 | Weekamp ................ 216/13 |
| 2004/0099917 A1 * | 5/2004 | Greathouse et al. ......... 257/414 |
| 2005/0168306 A1 * | 8/2005 | Cohn et al. .............. 335/78 |

* cited by examiner

*Primary Examiner*—Nitin Parekh
(74) *Attorney, Agent, or Firm*—Winston Hsu

(57) ABSTRACT

A method of fabricating protective caps for protecting devices on wafer surface includes: (a) providing a non-metal cap substrate and forming a metal layer on the non-metal cap substrate; (b) forming a plurality of cavities on a surface of the metal layer, wherein the location of each cavity corresponds to each of the devices on the wafer surface; and (c) forming a protective cap in each cavity and forming a plurality of bonding media around the cavities.

20 Claims, 13 Drawing Sheets

METHOD FOR FABRICATING PROTECTIVE CAPS FOR PROTECTING ELEMENTS ON A WAFER SURFACE

BACKGROUND OF THE INVENTION

1. Field of the Invention

The present invention relates to a method of fabricating protective caps, and more particularly, to a method of fabricating protective caps for protecting elements on a wafer surface.

2. Description of the Prior Art

Currently, wafer level chip scale packages (WLCSP) have become one of the most popular packaging techniques. The wafer level chip scale packages are defined by having correspondingly equal or larger areas of the package structure than the area of the die. The area of the package structure is usually no larger than 25% of the die area. In general, the main difference between the wafer level chip scale package and the conventional package lies in the fact that the wafer level chip scale package first packages the wafer before the dicing process and then performs a dicing process after the packaging process to form a plurality of packaging structures. This in comparison to the conventional package wherein the wafer is diced first to form a plurality of dies and a packaging process is performed for each of the dies thereafter.

Since part of the wafer surface usually includes fragile structures, such as micro-electromechanical structures, special processes are often performed to protect the micro-electromechanical structures on the wafer surface during the packaging process of the wafer. Currently, protective caps made of metal or glass are commonly disposed on the fragile structures to protect the fragile structures from external damage. The fabrication of the protective caps can be divided into two categories. A first category and method of fabricating the protective caps involves dicing the wafer into a plurality of dies and fabricating protective caps on the surface of each die thereafter. However, this method is relatively complex and requires significantly long processing time. Hence, another wafer level package process has been introduced to fabricate the protective caps.

Please refer to FIG. 1 through FIG. 3. FIG. 1 through FIG. 3 are perspective diagrams showing a wafer level package process according to the prior art. As shown in FIG. 1, a substrate 12 is provided, in which the surface of the substrate 12 includes a plurality of fragile structures 16, such as micro-electromechanical structures. Next, a second category and method of fabricating the protective caps involves providing a cap substrate 14, in which the surface of the cap substrate 14 includes a plurality of cavities 22, such that the cavities 22 are located corresponding to the fragile structures 16. Next, the cap substrate 14 is disposed on the substrate 12, in which the cavities 22 of the cap substrate 14 are corresponding to the fragile structures 16. Preferably, the cap substrate 14 also includes a plurality of bonding media 20 disposed on the periphery region surrounding the cavities 22, and a plurality of sealed rings 18 corresponding to the substrate 12, such that the bonding media 20 and the sealed rings 18 are utilized to bond the cap substrate 14 to the substrate 12.

As shown in FIG. 2, the cap substrate 14 and the substrate 12 are diced along the direction I to form a plurality of dies 30, in which the surface of each die 30 includes a protective cap 40 disposed on each of the fragile structures 16. As shown in FIG. 3, since the surface of the substrate 12 also includes a plurality of bonding pads 24 and the bonding pads 24 are covered by the protective caps 40, another dicing process must necessarily be performed along the direction II to dice the cap substrate 14 and expose the bonding pads 24 for facilitating electrical connection thereafter.

As a result, the two dicing processes utilized in the conventional packaging process will not only increase the possibility of misalignment, but also increase damage to the die resulting from pollution caused by micro-particles. Hence, if the number of dicing operations were to be reduced, damages resulted from the dicing process could be prevented and the yield of the package process could thereby be increased.

SUMMARY OF THE INVENTION

It is therefore an objective of the present invention to provide a package structure and package process for protecting devices on the wafer surface to solve the above-mentioned problems.

According to the present invention, a method of fabricating protective caps for protecting devices on wafer surface includes: (a) providing a non-metal cap substrate and forming a metal layer on the non-metal cap substrate; (b) forming a plurality of cavities on a surface of the metal layer, wherein the location of each cavity corresponds to each of the devices on the wafer surface; and (c) forming a protective cap in each cavity and forming a plurality of bonding media around the cavities.

It is another aspect of the present invention to provide a wafer level package process, in which the process includes: (a) providing a device substrate, wherein one surface of the device substrate comprises a plurality of devices; (b) providing a non-metal cap substrate and forming a metal layer on the non-metal cap substrate; (c) forming a plurality of cavities on one surface of the metal layer, wherein the location of each cavity is corresponding to the location of each device of the devices substrate; (d) forming a protective cap in each cavity by utilizing the cavity as a mold; (e) aligning each cavity of the cap substrate to each device of the device substrate and connecting the protective caps on the device substrate, such that each of the protective caps covers each device; and (f) removing the metal layer from the protective caps.

By mass-producing the protective caps for devices on wafer surface and eliminating the extra dicing process for protective caps, the present invention is able to significantly reduce damage to the wafer and devices from the dicing process and thereby increase the overall yield.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
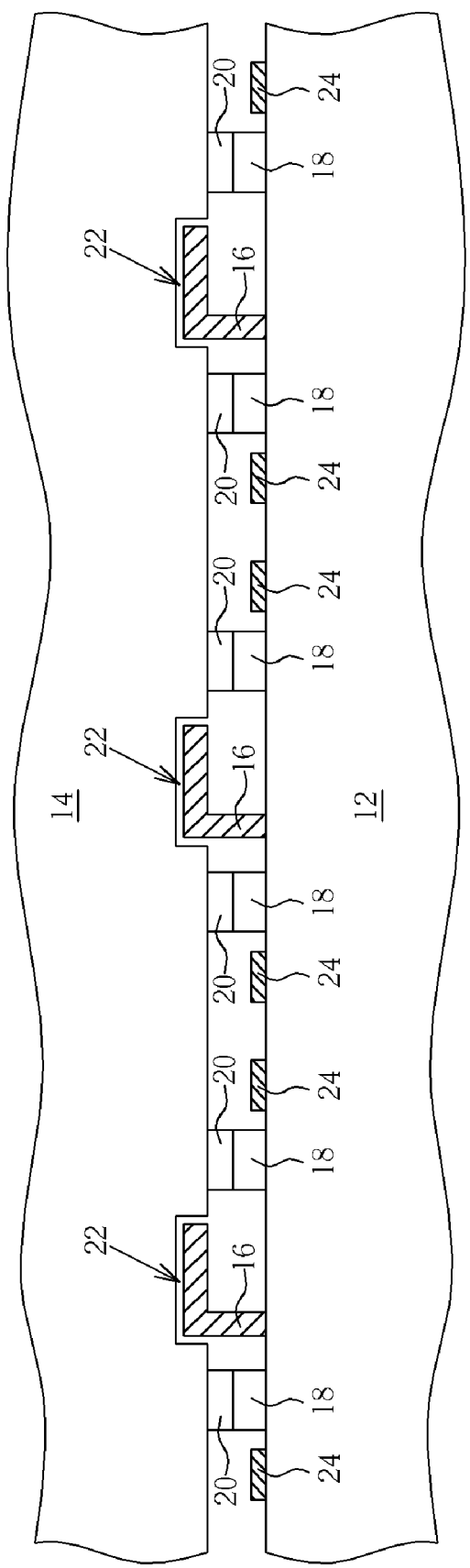
FIG. 1 through FIG. 3 are perspective diagrams showing a wafer level package process according to the prior art.
Figure 2:
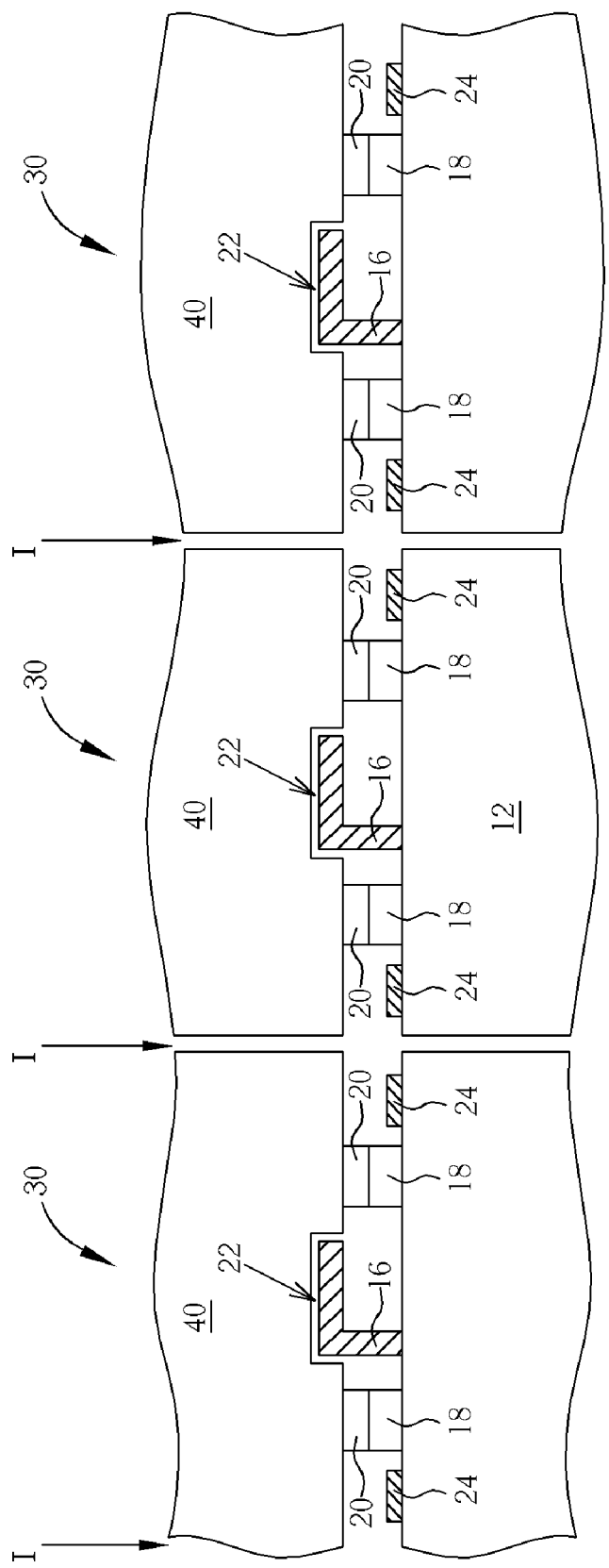
Figure 3:
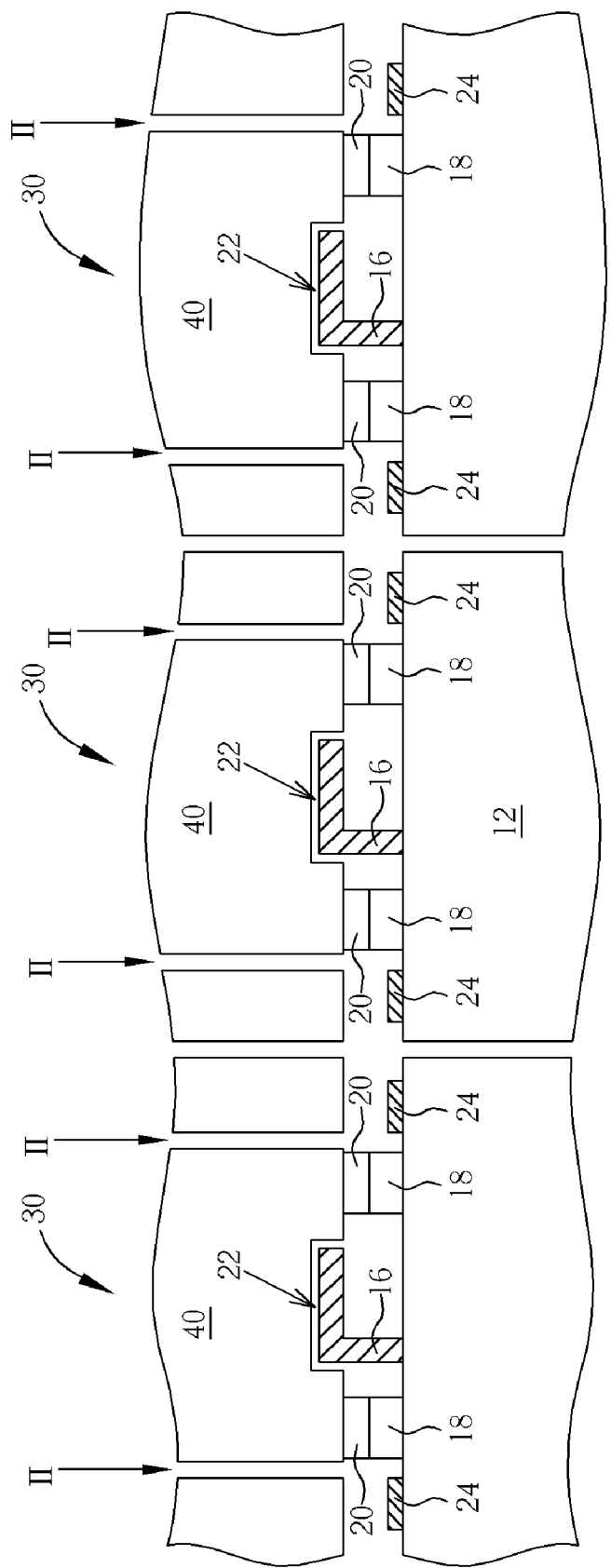
Figure 4:
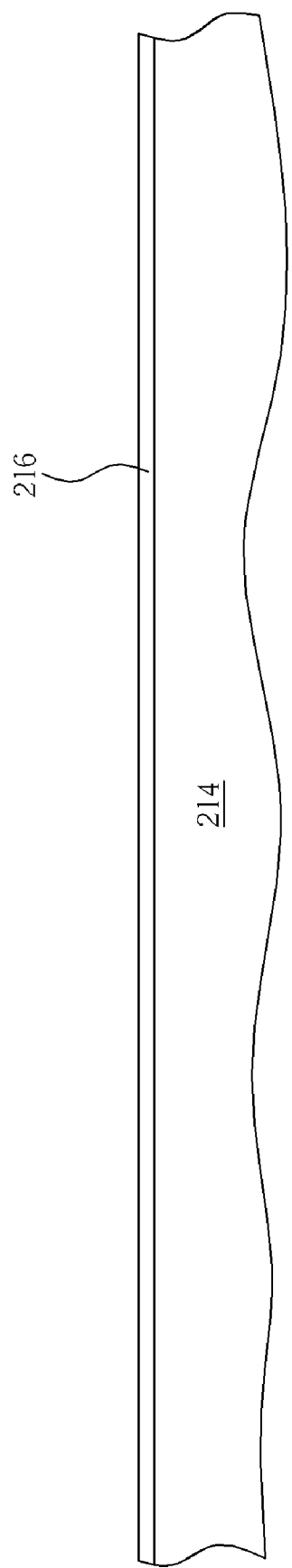
FIG. 4 through FIG. 7 are perspective diagrams showing the means of fabricating protective caps according to a preferred embodiment of the present invention.
Figure 5:
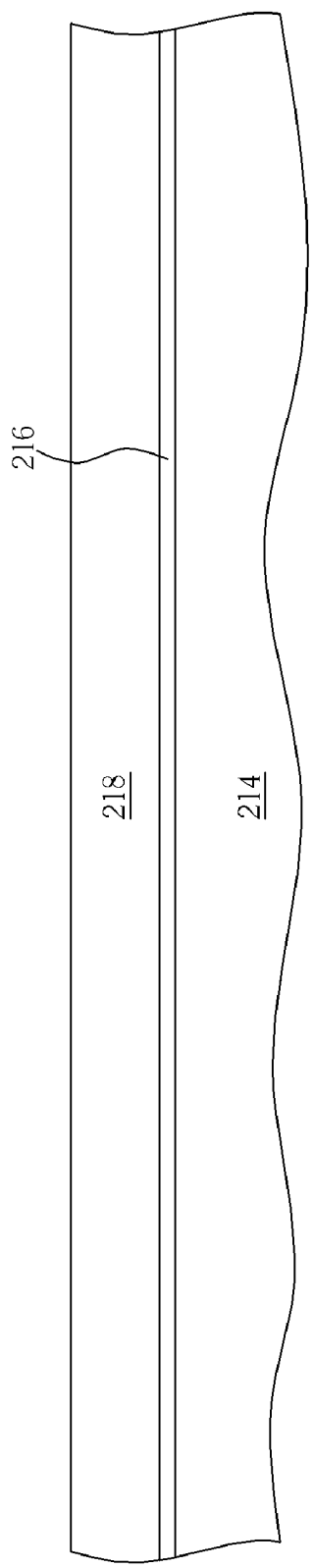

Please refer to FIG. 4 through FIG. 7. FIG. 4 through FIG. 7 are perspective diagrams showing the means of fabricating protective caps according to the preferred embodiment of the present invention. As shown in FIG. 4, a non-metal cap substrate 214, such a semiconductor substrate is provided, in which the non-metal cap substrate 214 can be a silicon substrate, a glass substrate, a quartz substrate, or a plastic substrate. Next, a seed layer 216 is formed on the non-metal cap substrate 214, in which the seed layer 216 is composed of titanium, copper or other materials commonly utilized for forming seed layers. Next, as shown in FIG. 5, a plating process is performed to form a metal layer 218 on the seed layer 216, in which the metal layer 218 is composed of copper or other materials.

Figure 6:
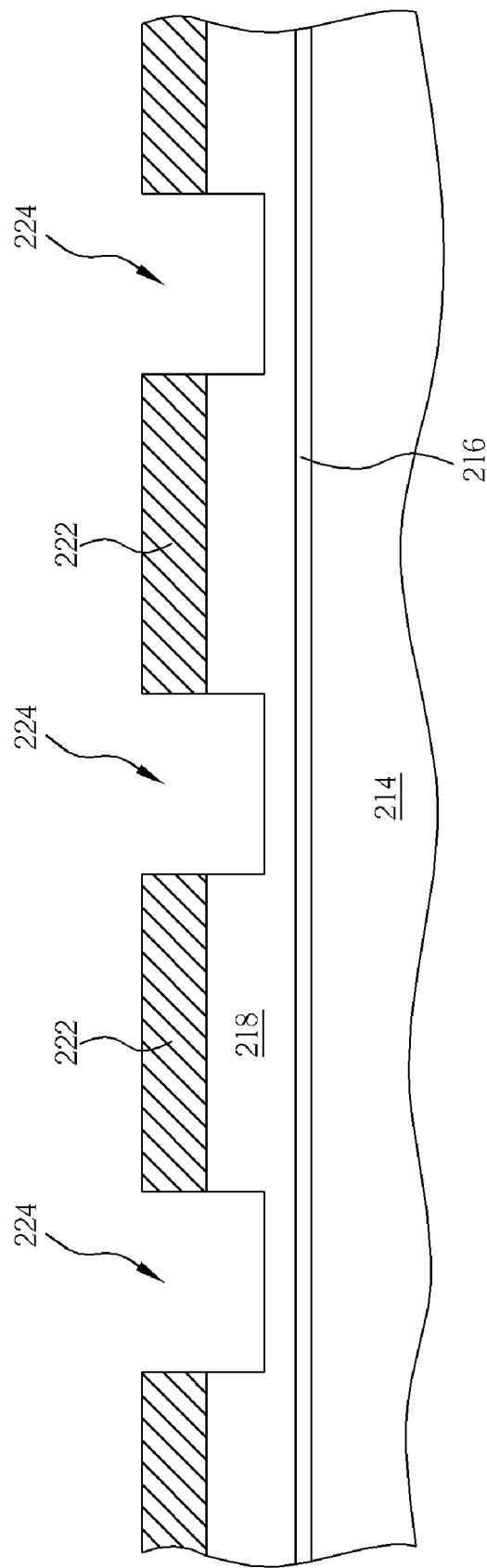

As shown in FIG. 6, a patterned mask 222 is disposed on the metal layer 218, and an etching process is performed to etch the metal layer 218 not covered by the patterned mask 222 for forming a plurality of cavities 224. Preferably, the cavities 224 are utilized to fabricate protective caps for protecting fragile devices on the wafer surface, and the location of the cavities 224 is adjusted corresponding to the location of the fragile structures or other devices on the surface of the wafer.

Figure 7:
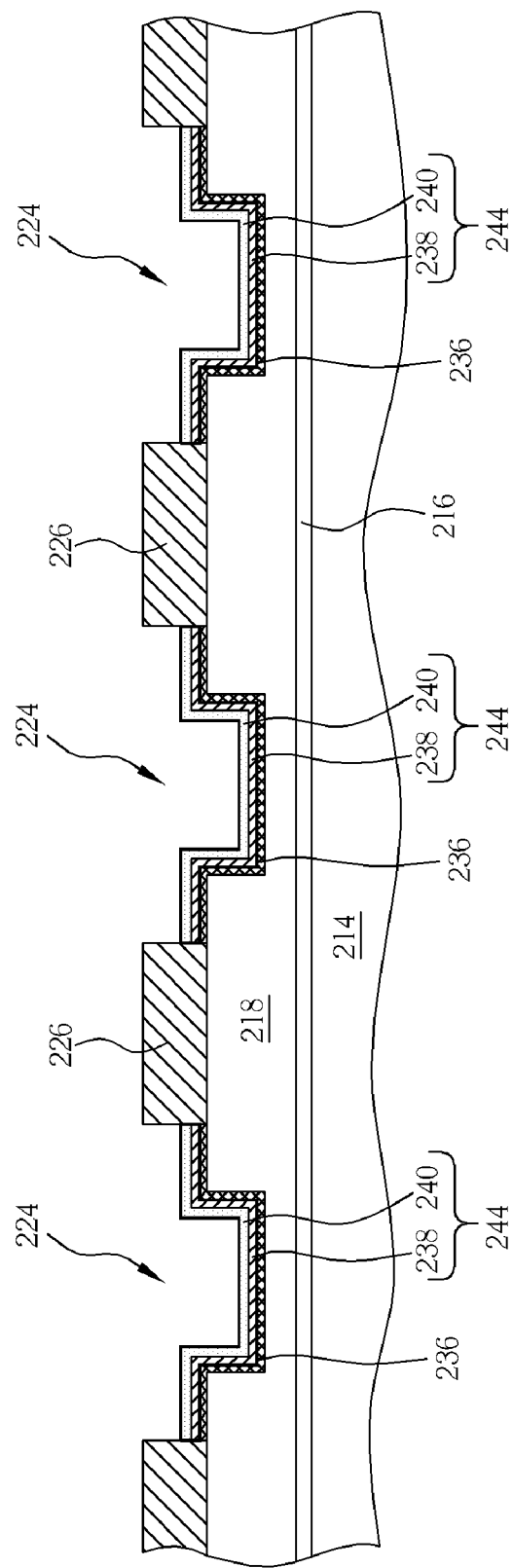

Next, as shown in FIG. 7, the patterned mask 222 is removed and another patterned mask 226 is formed on the surface of the metal layer 218, in which the patterned mask 226 exposes the cavities 224 and the area surrounding the cavities 224. Next, a plating process, such as an electroplating process, is performed to form a plurality of protective caps 236 on the exposed metal layer 218, in which the protective caps 236 are composed of metal or other materials. For instance, if the devices to be protected are composed of light sensitive materials, the protective cap 236 can be made up of light-penetrating materials such as glass or quartz. Additionally, since the protective caps 236 will be detached from the metal layer 218 in a later process, the material utilized for fabricating the protective caps 236 should be selected accordingly. For instance, when copper is utilized to fabricate the metal layer 218, nickel can be selected to fabricate the protective caps 236 to facilitate the removal of the metal layer 218 from the protective caps 236 during the etching process.

After the formation of the protective caps 236, a plurality of bonding media 244 is formed on the protective caps 236. According to the preferred embodiment of the present invention, the bonding media 244 is composed of a double layer structure having a tin layer 238 and a gold layer 240. Nevertheless, other materials can also be utilized to form the bonding media 244. The patterned mask 226 is removed thereafter.

Figure 8:
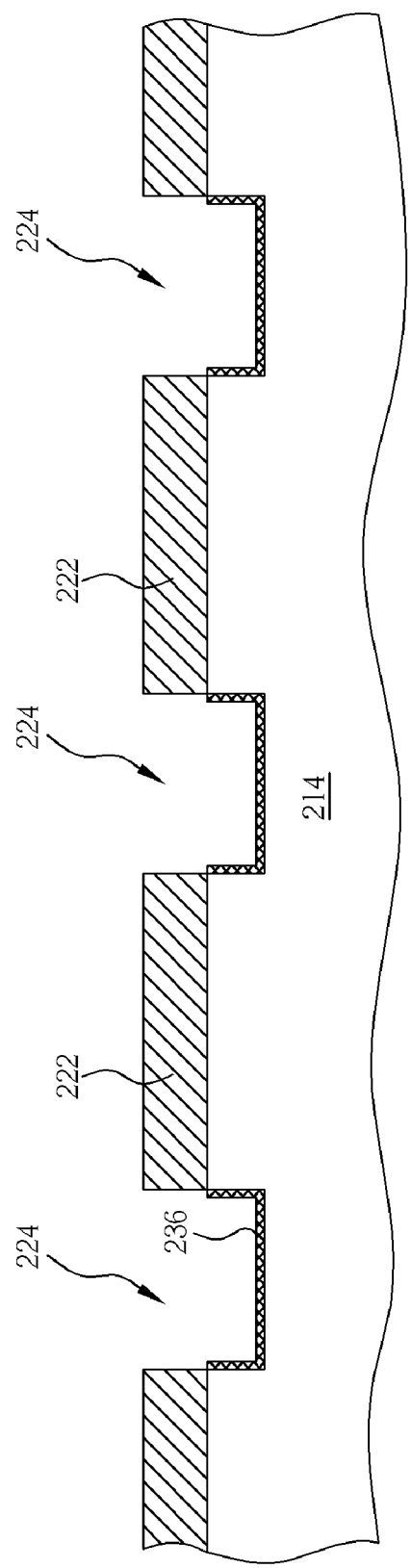
FIG. 8 and FIG. 9 are perspective diagrams showing the means of fabricating protective caps and bonding media according to another embodiment of the present invention.
Figure 9:
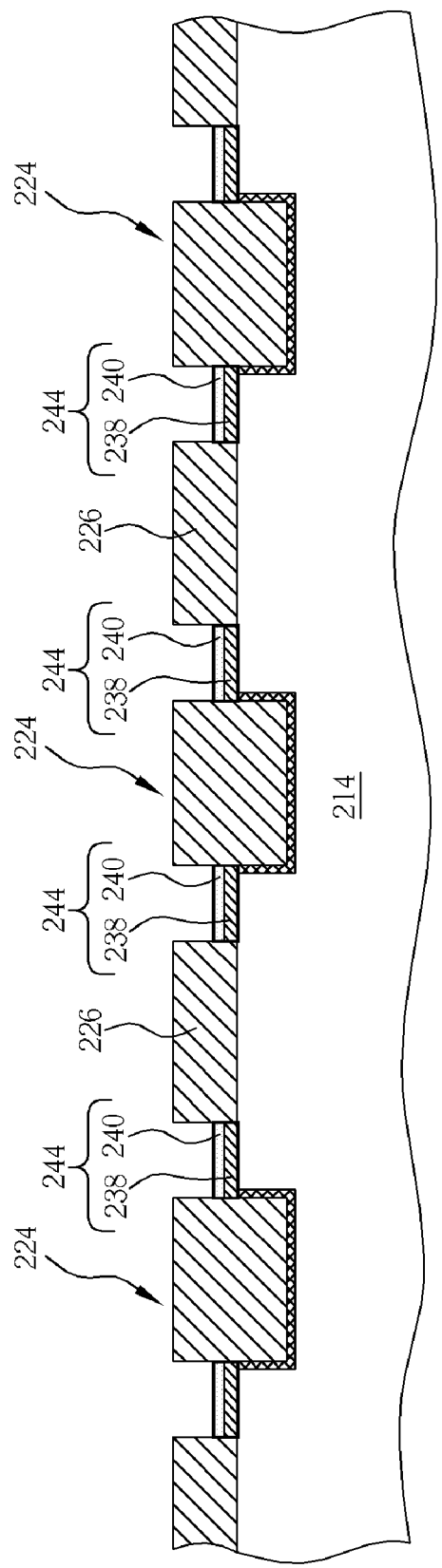

Preferably, the protective caps 236 are utilized to protect the devices on the surface of the wafer and the bonding media 244 are utilized to connect to the sealed rings fabricated in the later stage of the fabrication process and fix the protective caps 236 on the devices. Depending on the functionality of each component, the fabrication of the protective caps 236 and the bonding media 244 is not limited to the process described previously. Please refer to FIG. 8 and FIG. 9. FIG. 8 and FIG. 9 are perspective diagrams showing the means of fabricating protective caps and bonding media according another embodiment of the present invention. In order to compare to the embodiment discussed previously, same labels will be carried forward through FIG. 8 and FIG. 9. As shown in FIG. 8, the plurality of protective caps 236 is formed in the cavities 224 while maintaining the patterned mask 222 after the formation of the cavities 224. As shown in FIG. 9, the patterned mask 222 is removed and another patterned mask 226 is formed on the non-metal cap substrate 214, in which the patterned mask 226 only exposes the surrounding area of the cavities 224. Next, a plating process is performed to form the bonding media 224 around the cavities 224, in which the bonding media 224 is composed of a tin layer 238 and a gold layer 240. The patterned mask 226 is removed thereafter.

Figure 10:
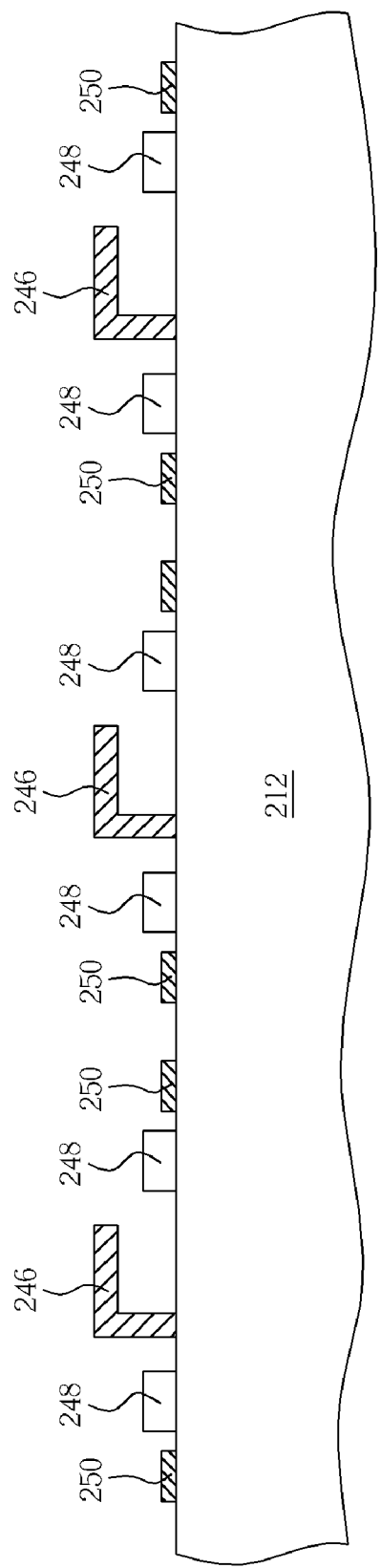
FIG. 10 through FIG. 12 are perspective diagrams showing a wafer level package process according to another embodiment of the present invention.
Figure 11:
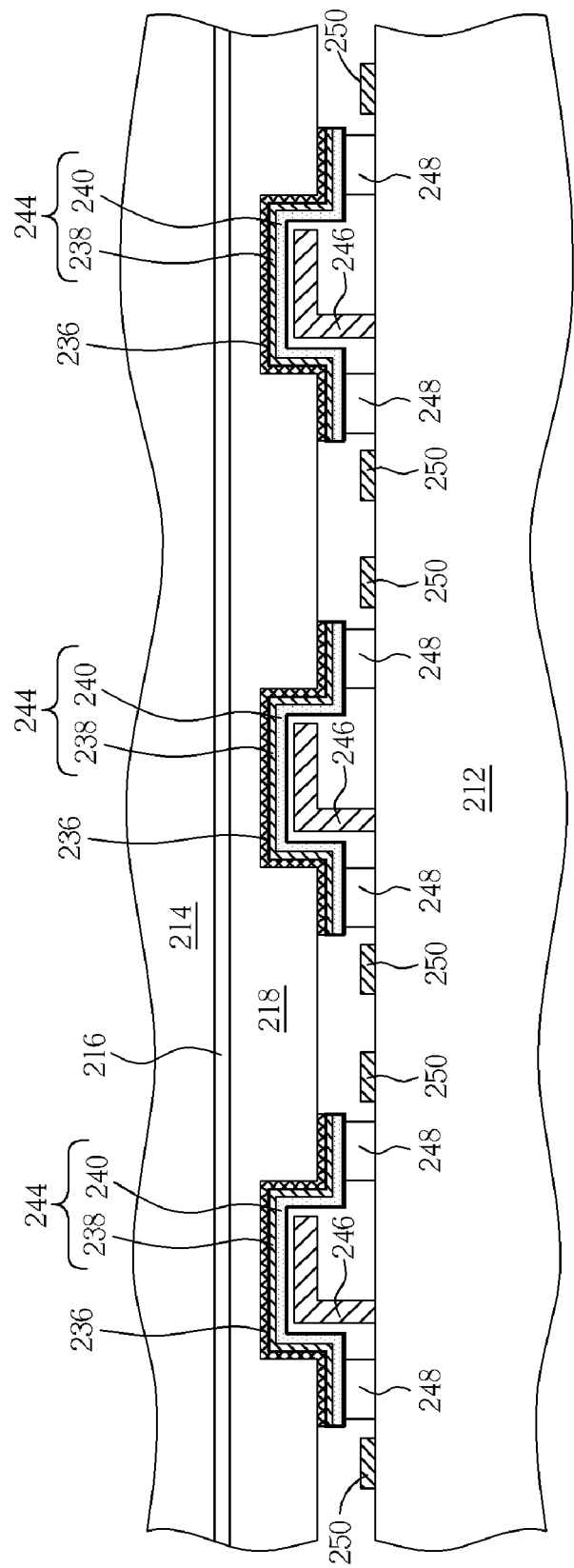
Figure 12:
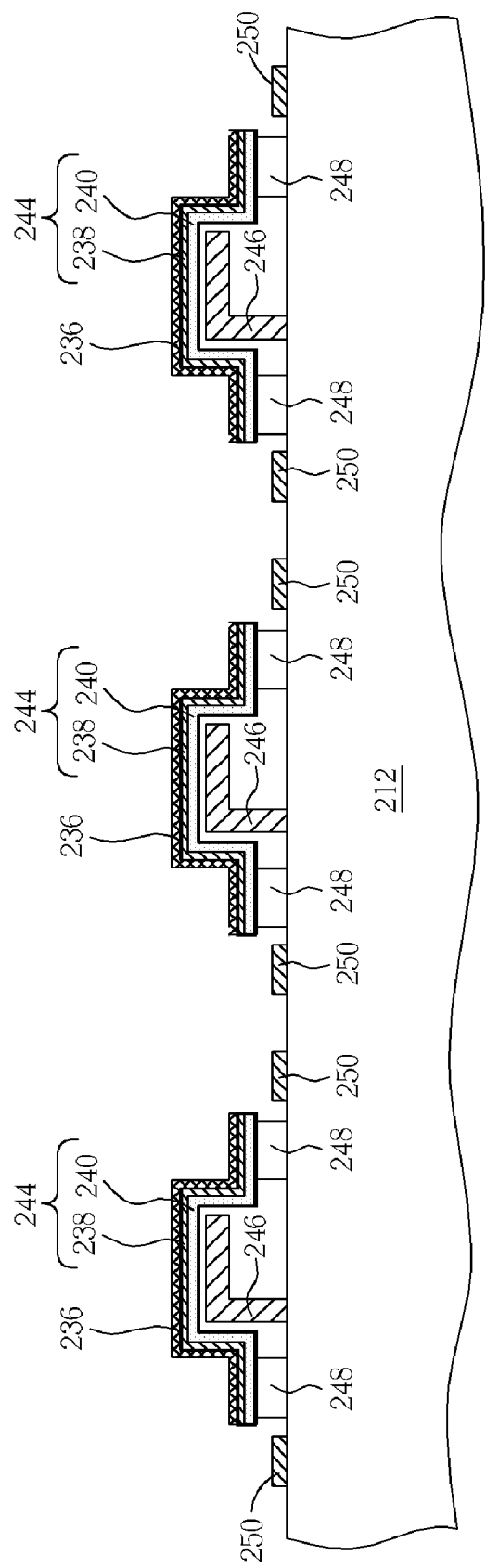

According to another embodiment of the present invention, a wafer level package process is introduced to package the protective caps discussed previously onto the fragile structures or other devices on the wafer surface. Please refer to FIG. 10 through FIG. 12. FIG. 10 through FIG. 12 are perspective diagrams showing a wafer level package process according to another embodiment of the present invention. As shown in FIG. 10, a device substrate 212 is provided, in which the surface of the device substrate 212 includes a plurality of devices 246. Preferably, the devices 246 are micro-electro-mechanical devices, light sensitive devices, or other devices. Additionally, a plurality of sealed rings 248 is disposed around the devices 246 for protecting the devices 246 in the later process. Furthermore, the surface of the device substrate 212 includes a plurality of bonding pads 250 for electrically connecting to other devices.

Next, as shown in FIG. 11, the protective caps 236 fabricated on the non-metal cap substrate 214 are disposed on the device substrate 212, such that each protective cap 236 covers each device 246, and the protective caps 236 are fixed on the sealed rings 248 by utilizing the bonding media 244. Next, as shown in FIG. 12, the non-metal cap substrate 214 and the metal layer 218 are removed, in which the removal of the non-metal cap substrate 214 may involve the utilization of a mechanical polishing process or an etching process. After the non-metal cap substrate 214 is detached from the metal layer 218, the metal layer 218 will be removed from the protective caps 236. According to the preferred embodiment of the present invention, the metal layer 218 is composed of copper whereas the protective caps 236 are composed of nickel. Since copper exhibits a higher etching selectivity relative to nickel, an etching process is then performed to remove the metal layer 218. Nevertheless, other process can also be utilized to achieve the same goal.

Figure 13:
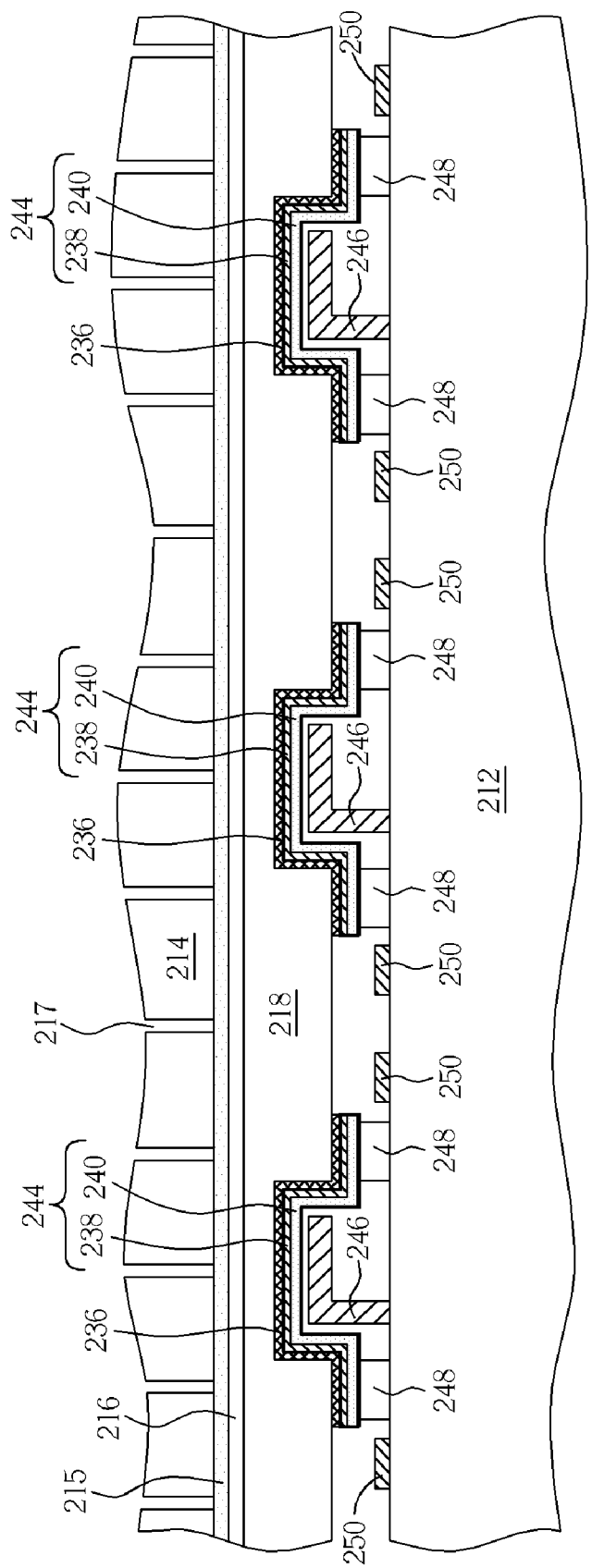
FIG. 13 is a perspective diagram showing a means of removing the non-metal cap substrate according to another embodiment of the present invention.

Please refer to FIG. 13. FIG. 13 is a perspective diagram showing a means of removing the non-metal cap substrate 214 according to another embodiment of the present invention. As shown in FIG. 13, an adhesive layer 215 is formed over the surface of the non-metal cap substrate 214 and a plurality of through holes 217 is formed within the non-metal cap substrate 214 before the deposition of the seed layer 216. Hence, if the non-metal cap substrate 214 were to be removed, the present invention is able to inject a releasing agent into the through holes 217 to quickly release the non-metal cap substrate 214 from the metal layer 218. By utilizing this method, the non-metal cap substrate 214 can be used repeatedly thereby saving resources.

By utilizing the protective caps 236 to cover only the devices 246 on the device substrate 212 but not the bonding pads 250, the present invention requires no additional dicing process for exposing the bonding pads 250, results in no influence on the electrical connection of the device substrate 212, thereby significantly reducing the damage to the wafer and the devices resulted from the dicing process and increasing the overall yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer level package process comprising steps:
   (a) providing a device substrate, wherein one surface of the device substrate comprises a plurality of devices and a sealed ring;
   (b) providing a non-metal cap substrate and forming a metal layer on the non-metal cap substrate;
   (c) patterning the metal layer to form a plurality of cavities on one surface of the metal layer, wherein the location of each cavity corresponds to the location of each device of the devices substrate;
   (d) forming a protective cap in each cavity by utilizing the cavity as a mold;
   (e) aligning each cavity of the non-metal cap substrate to each device of the device substrate and connecting the protective caps on the sealed ring of the device substrate, such that each of the protective caps covers each device; and
   (f) removing the metal layer of the non-metal cap substrate from the protective caps.

2. The wafer level package process of claim 1, wherein the non-metal cap substrate is a semiconductor substrate.

3. The wafer level package process of claim 1, wherein the step of forming the metal layer on the non-metal cap substrate is achieved by an electroplating process.

4. The wafer level package process of claim 1 further comprising:
   (e1) removing the non-metal cap substrate from the metal layer before performing step (f).

5. The wafer level package process of claim 4, wherein step (e1) further comprises utilizing an etching process for removing the non-metal cap substrate.

6. The wafer level package process of claim 4 further comprising forming an adhesive layer between the non-metal cap substrate and the metal layer.

7. The wafer level package process of claim 6, wherein step (e1) is achieved by removing the adhesive layer.

8. The wafer level package process of claim 6, wherein the non-metal cap substrate is a mold, such that the non-metal cap substrate further comprises a plurality of through holes.

9. The wafer level package process of claim 8, wherein the step (e1) further comprises utilizing a releasing agent for removing the adhesive layer.

10. The wafer level package process of claim 1, wherein the protective caps are metal protective caps.

11. The wafer level package process of claim 1, wherein the devices comprise micro-electromechanical devices.

12. The wafer level package process of claim 1, wherein step (d) further comprises:
   forming a patterned mask on the metal layer, wherein the patterned mask exposes the cavities and the area surrounding the cavities;
   performing at least a first plating process for forming a plurality of protective caps in and around the cavities; and
   performing at least a second plating process for forming a plurality of bonding media around the protective caps and in and around the cavities.

13. The wafer level package process of claim 12, wherein the metal layer comprises a first metal and the protective caps comprise a second metal.

14. The wafer level package process of claim 13, wherein step (f) is achieved by etching the first metal.

15. The wafer level package process of claim 13, wherein the first metal comprises copper and the second metal comprises nickel.

16. The wafer level package process of claim 12, wherein each of the bonding media comprises a third metal and a fourth metal stacked over one another.

17. The wafer level package process of claim 16, wherein the third metal comprises tin and the fourth metal comprises gold.

18. The wafer level package process of claim 1, wherein the protective caps comprise light-penetrating protective caps.

19. The wafer level package process of claim 1, wherein the devices comprise light sensitive devices.

20. The wafer level package process of claim 1, wherein the surface of the device substrate comprises a plurality of bonding pads, wherein the bonding pads are not covered by the protective caps.

* * * * *